United States Patent
Moon

(10) Patent No.: US 10,367,007 B2
(45) Date of Patent: Jul. 30, 2019

(54) DISPLAY DEVICE AND METHOD OF MANUFACTURING THE SAME

(71) Applicant: Samsung Display Co., Ltd., Yongin-si, Gyeonggi-do (KR)

(72) Inventor: Youngmin Moon, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 274 days.

(21) Appl. No.: 15/205,447

(22) Filed: Jul. 8, 2016

(65) Prior Publication Data

US 2017/0018575 A1  Jan. 19, 2017

(30) Foreign Application Priority Data

Jul. 15, 2015 (KR) .......................... 10-2015-0100450

(51) Int. Cl.
*H01L 27/12* (2006.01)
*H01L 21/8234* (2006.01)
(Continued)

(52) U.S. Cl.
CPC .......... *H01L 27/124* (2013.01); *G02F 1/1368* (2013.01); *G02F 1/134363* (2013.01);
(Continued)

(58) Field of Classification Search
None
See application file for complete search history.

(56) References Cited

U.S. PATENT DOCUMENTS

| 8,716,702 | B2 | 5/2014 | Kim | |
|---|---|---|---|---|
| 2008/0002087 | A1* | 1/2008 | Kim | G02F 1/136286 349/46 |
| 2010/0140613 | A1* | 6/2010 | Kimura | H01L 27/1225 257/43 |

FOREIGN PATENT DOCUMENTS

| KR | 10-2009-0027288 A | 3/2009 |
|---|---|---|
| KR | 10-2012-0042143 A | 5/2012 |

(Continued)

OTHER PUBLICATIONS

Sara A. Dibenedetto, Molecular Self-Assembled Monolayers and Multilayers for Organic and Unconventional Inorganic Thin-Film Transistor Applications, Advanced Materials, Apr. 2009, vol. 21, pp. 1407-1433, WILEY-VCH Verlag GmbH & Co. KGaA, Weinheim, Germany.

G. Kane Jennings, Effect of Chain Length on the Protection of Copper by n-Alkanethiols, Langmuir, vol. 14, pp. 6130-6139, Jul. 22, 1998, Department of Chemical Engineering, Massachusetts Institute of Technology, Cambridge, Massachusetts.

(Continued)

*Primary Examiner* — Stephanie P Duclair
(74) *Attorney, Agent, or Firm* — Innovation Counsel LLP

(57) ABSTRACT

A display device capable of reducing the number of manufacturing processes and manufacturing costs and a method of manufacturing the display device are provided, the display device including: a first substrate; a gate transmission member and a pixel electrode on the first substrate; a gate insulating layer on the gate transmission member and the pixel electrode; a semiconductor layer on the gate insulating layer, the semiconductor layer overlapping a gate electrode of the gate transmission member; and a source electrode and a drain electrode on the semiconductor layer, wherein the gate transmission member includes a first conductive layer pattern and a second conductive layer pattern on the first conductive layer pattern, the first conductive layer pattern including a material the same as a material forming the pixel electrode.

14 Claims, 17 Drawing Sheets

(51) Int. Cl.
*H01L 21/8238* (2006.01)
*H01L 21/027* (2006.01)
*G02F 1/1343* (2006.01)
*G02F 1/1368* (2006.01)

(52) U.S. Cl.
CPC ...... *H01L 21/0273* (2013.01); *H01L 21/0274* (2013.01); *H01L 21/823437* (2013.01); *H01L 21/823462* (2013.01); *H01L 21/823857* (2013.01); *H01L 27/1262* (2013.01); *H01L 27/1288* (2013.01); *G02F 2201/123* (2013.01)

(56) References Cited

FOREIGN PATENT DOCUMENTS

| KR | 10-2013-0060900 A | 6/2013 |
| KR | 10-2013-0065256 A | 6/2013 |

OTHER PUBLICATIONS

Toshiaki Arai, Highly Reliable Oxide-Semiconductor TFT for AM-OLED Display, SID Symposium Digest of Technical Papers, Jul. 2010, vol. 41, session 69.2, pp. 1033-1036, John Wiley & Sons, Inc.

\* cited by examiner

\* G : GL, GE, 194

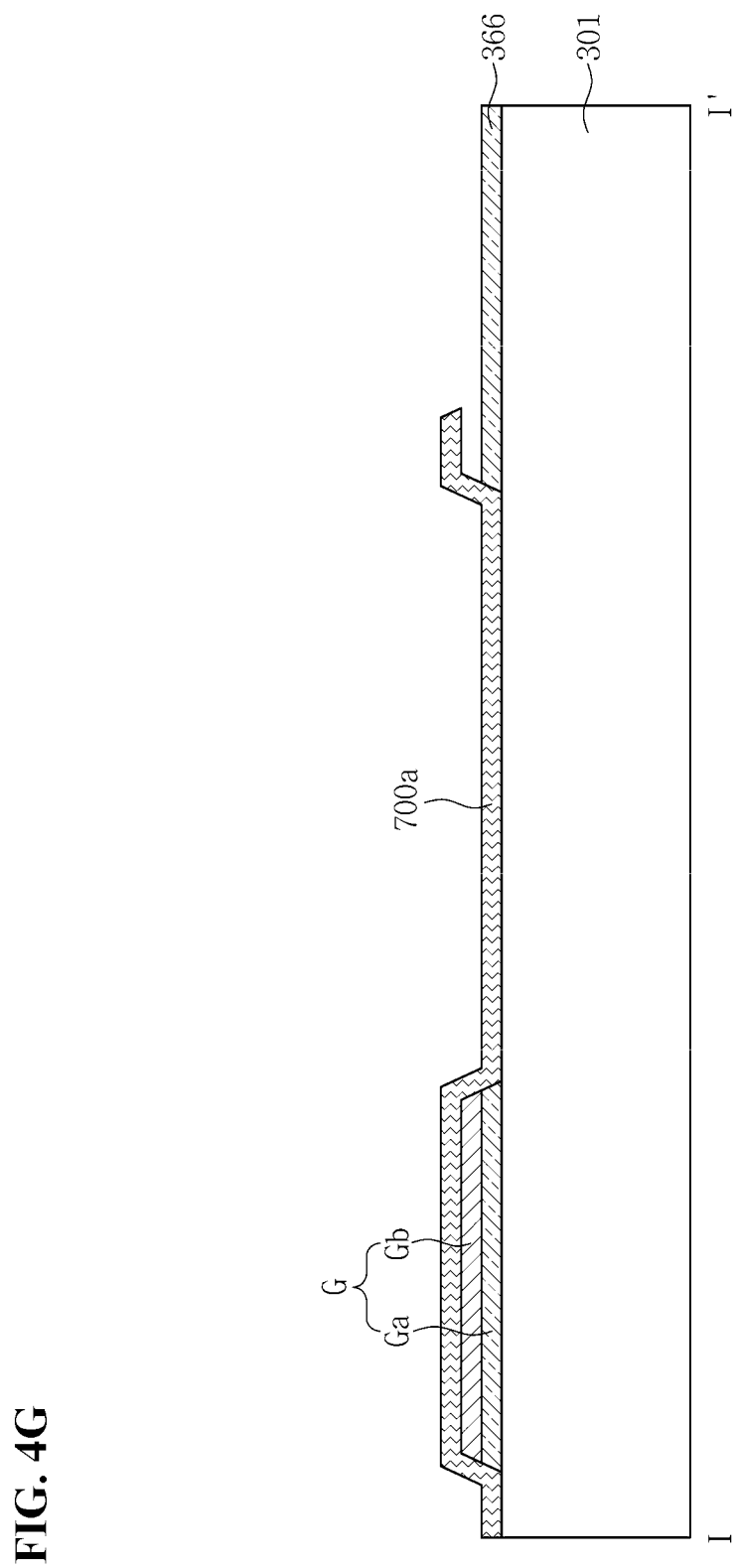

DISPLAY DEVICE AND METHOD OF MANUFACTURING THE SAME

CROSS-REFERENCE TO RELATED APPLICATION

This application claims the priority to and all the benefits accruing under 35 U.S.C. § 119 of Korean Patent Application No. 10-2015-0100450, filed on Jul. 15, 2015, with the Korean Intellectual Property Office (KIPO), the disclosure of which is incorporated herein in its entirety by reference.

BACKGROUND

1. Field

Embodiments of the present inventive concept relate to a display device, and more particularly, to a display device capable of reducing the number of manufacturing processes and manufacturing costs, and a method of manufacturing the display device.

2. Description of the Related Art

A liquid crystal display ("LCD") device is a type of flat panel display ("FPD") devices that is widely used recently. An LCD device includes two substrates having electrodes respectively formed thereon and a liquid crystal layer interposed between the two substrates. In an LCD device, liquid crystal molecules of the liquid crystal layer are rearranged by voltages that are applied to the two electrodes, thereby adjusting the amount of transmitted light and displaying an image on the LCD device.

Despite the ease of slimming, LCD devices may have a disadvantage such as relatively low side visibility as compared to front visibility. To address such issues, various schemes of arranging and driving liquid crystals have been developed. In addition, to provide a wide viewing angle, research is being continuously conducted on an LCD device in a plane to line switching ("PLS") mode in which a pixel electrode and a common electrode are formed on a single substrate.

Meanwhile, an LCD device in a PLS mode requires a greater number of mask processes than the number of mask processes required in an LCD device in a twisted nematic ("TN") mode, thus increasing the manufacturing costs thereof.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present inventive concept are directed to a display device capable of forming a pixel electrode and a gate transmission member in a single mask process, and a method of manufacturing the display device.

According to an exemplary embodiment of the present inventive concept, a method of manufacturing a display device includes: forming a first conductive layer on a substrate; forming a second conductive layer on the first conductive layer; forming a first photoresist pattern and a second photoresist pattern on the second conductive layer, the second photoresist pattern having a thickness greater than a thickness of the first photoresist pattern; removing the first and second conductive layers using the first and second photoresist patterns as masks, to thereby form a gate transmission member and a pixel electrode pattern each including a first conductive layer pattern and a second conductive layer pattern; removing the first photoresist pattern to thereby form a residual pattern of the second photoresist pattern on the pixel electrode pattern; forming an etch stop layer on the gate transmission member and the residual pattern; removing the residual pattern to thereby form an etch stop layer pattern through which the second conductive layer pattern of the pixel electrode pattern is exposed; and removing the second conductive layer pattern of the pixel electrode pattern using the etch stop layer pattern as a mask, to thereby form a pixel electrode.

The method may further include removing the etch stop layer pattern.

The etch stop layer may include a self-assembled monolayer.

The self-assembled monolayer may include a compound represented by the following Chemical Formula 1:

[Chemical Formula 1]

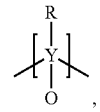

wherein Y is one of sulfur, silicon, phosphorus, carbon, sulfur bonded to a substituent, silicon bonded to a substituent, phosphorus bonded to a substituent, and carbon bonded to a substituent; wherein R is one selected from a C6-C30 hydrocarbon group, a C6-C30 aromatic group, a C5-C30 heteroaromatic group including at least one heteroatom, a C1-C20 alkyl group, a C6-C30 hydrocarbon group bonded to a substituent, a C6-C30 aromatic group bonded to a substituent, a C5-C30 heteroaromatic group including at least one heteroatom and bonded to a substituent, and a C1-C20 alkyl group bonded to a substituent; and wherein the substituent includes at least one of halogen, a C1-C12 alkyl group, a C1-C12 alkyl group bonded to another substituent, an alkoxy group, an ether group, a carboxyl group, a thiol group, and an amine group.

A main chain of the C1-C20 alkyl group may contain at least one of

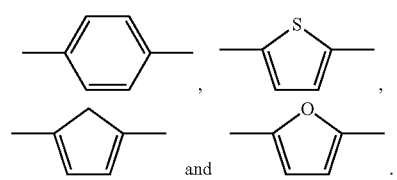

The self-assembled monolayer may include a compound represented by the following Chemical Formula 2:

[Chemical Formula 2]

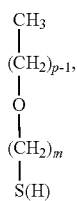

wherein m and p are each an integer in a range of 1 to 10.

The etch stop layer may be formed over an entire surface of the substrate including the gate transmission member and the residual pattern except on a side surface of the residual pattern.

The etch stop layer has a disconnection portion along an edge of the residual pattern.

The residual pattern may have a thickness and a width less than a thickness and a width of the second photoresist pattern.

One surface of the residual pattern facing the second conductive layer pattern and a side surface of the residual pattern may form an obtuse angle therebetween.

The one surface of the residual pattern facing the second conductive layer pattern may have a planar area smaller than a planar area of another surface of the residual pattern opposite to the one surface of the residual pattern facing the second conductive layer pattern.

The first conductive layer may include at least one of indium-tin oxide ("ITO"), indium-zinc oxide ("IZO"), aluminum-zinc oxide ("AZO"), and indium-gallium-zinc oxide ("IGZO").

The second conductive layer may include at least one of molybdenum (Mo), chromium (Cr), titanium (Ti), aluminum (Al), silver (Ag), and copper (Cu).

The gate transmission member may include a gate electrode and a gate line.

According to an exemplary embodiment of the present inventive concept, a display device includes: a first substrate; a gate transmission member and a pixel electrode on the first substrate; a gate insulating layer on the gate transmission member and the pixel electrode; a semiconductor layer on the gate insulating layer, the semiconductor layer overlapping a gate electrode of the gate transmission member; and a source electrode and a drain electrode on the semiconductor layer, wherein the gate transmission member includes a first conductive layer pattern and a second conductive layer pattern on the first conductive layer pattern, the first conductive layer pattern including a material the same as a material forming the pixel electrode.

The second conductive layer pattern may include remnants of a self-assembled monolayer.

The first conductive layer pattern may include at least one of indium-tin oxide ("ITO"), indium-zinc oxide ("IZO"), aluminum-zinc oxide ("AZO"), and indium-gallium-zinc oxide ("IGZO").

The second conductive layer pattern may include at least one of molybdenum (Mo), chromium (Cr), titanium (Ti), aluminum (Al), silver (Ag), and copper (Cu).

The display device may further include: a second substrate opposing the first substrate; and a liquid crystal layer between the first substrate and the second substrate.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of inventive concept will be more clearly understood from the following detailed description taken in conjunction with the accompanying drawings, in which:

FIGS. 4A, 4B, 4C, 4D, 4E, 4F, 4G, 4H, 4I, 4J, 4K, 4L, 4M and 4N are views illustrating a method of manufacturing a display device according to an exemplary embodiment.

DETAILED DESCRIPTION

Figure 1:
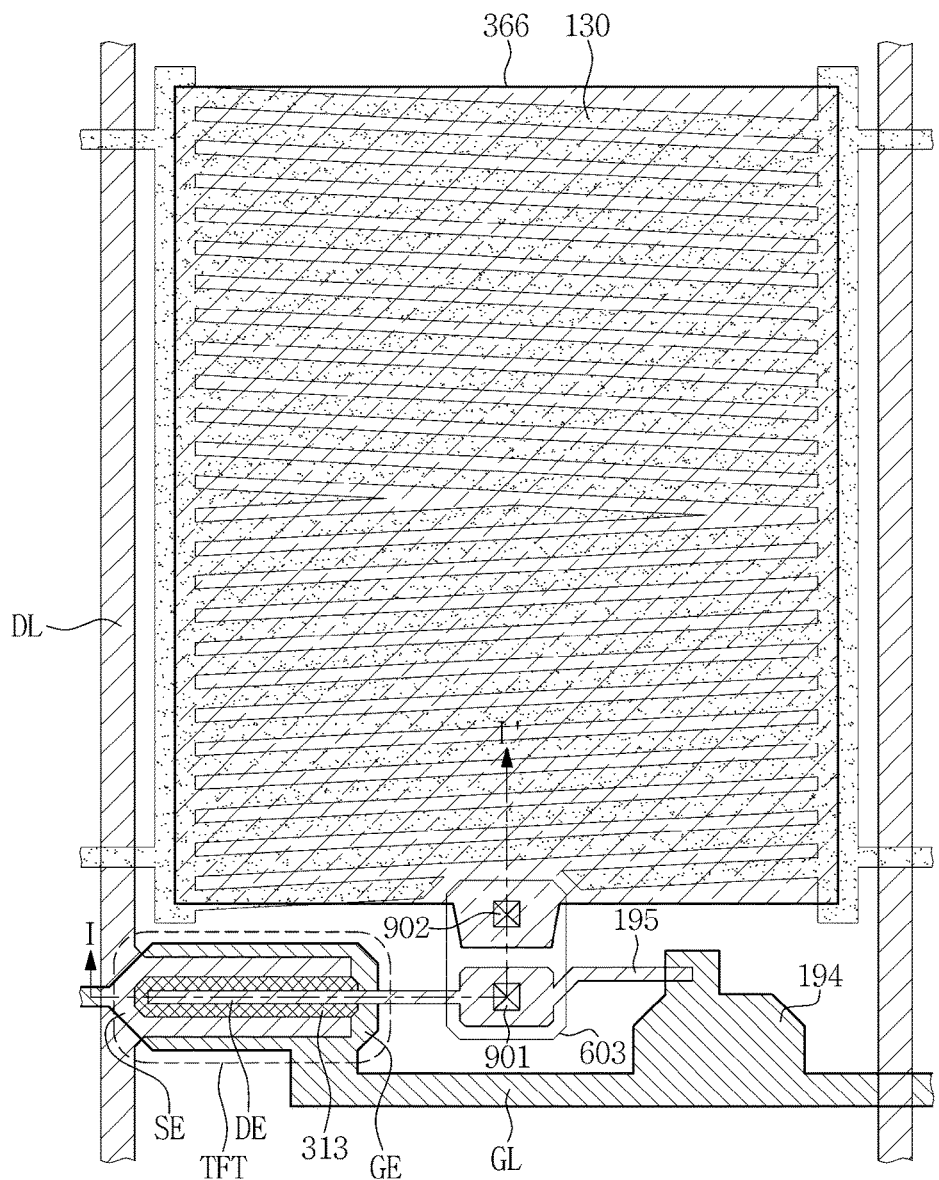
FIG. 1 is a plan view illustrating a pixel of a display device according to an exemplary embodiment.

Advantages and features of the present inventive concept and methods for achieving them will be made clear from exemplary embodiments described below in detail with reference to the accompanying drawings. The present inventive concept may, however, be embodied in many different forms and should not be construed as being limited to the exemplary embodiments set forth herein. Rather, these exemplary embodiments are provided so that this disclosure will be thorough and complete, and will fully convey the scope of the inventive concept to those skilled in the art. The present inventive concept is merely defined by the scope of the claims. Therefore, well-known constituent elements, operations and techniques are not described in detail in the exemplary embodiments in order to prevent the present inventive concept from being obscurely interpreted. Like reference numerals refer to like elements throughout the specification.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
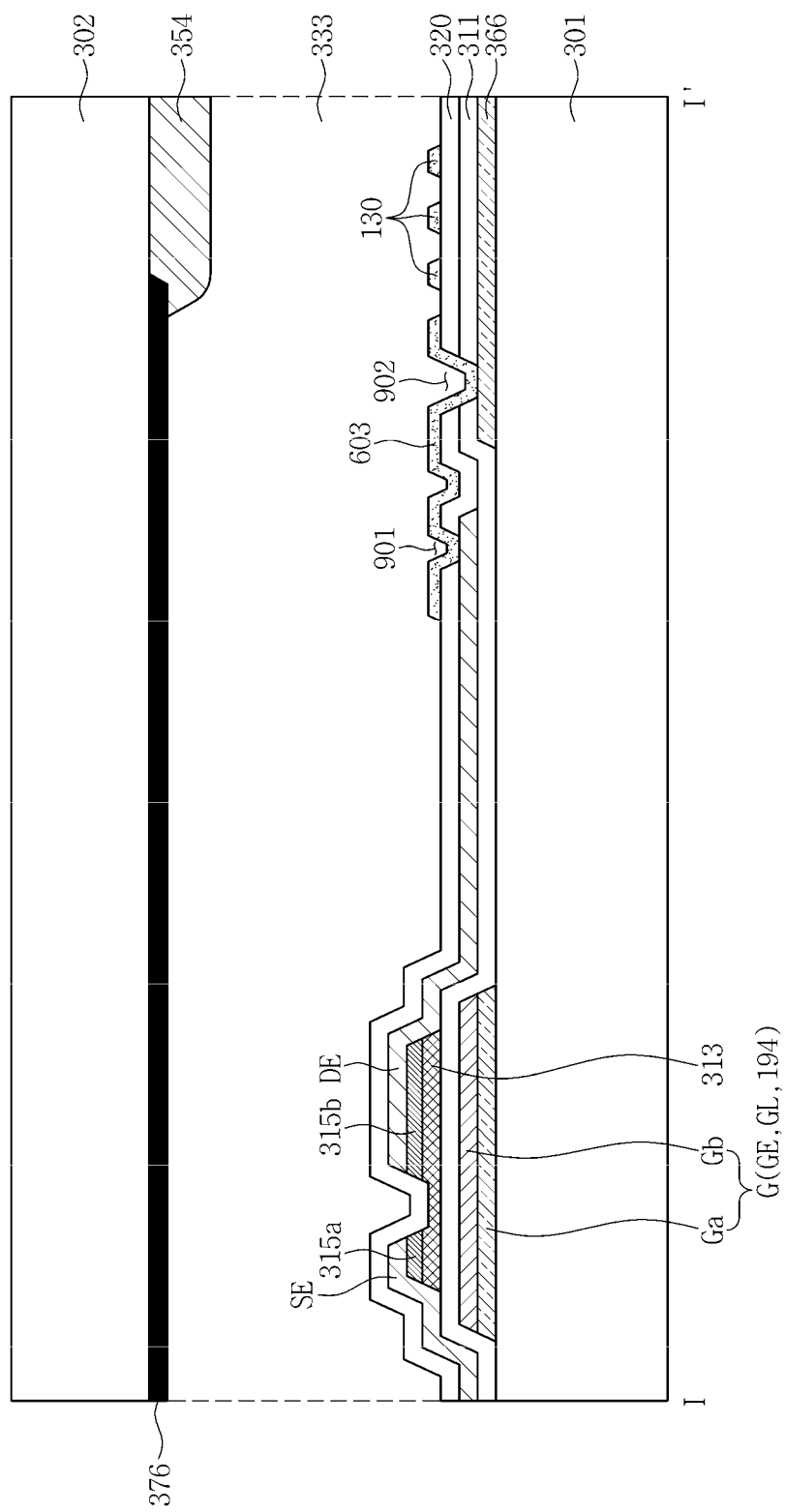
FIG. 2 is a cross-sectional view taken along section line I-I' of FIG. 1.

FIG. 1 is a plan view illustrating a pixel of a display device according to an exemplary embodiment. FIG. 2 is a cross-sectional view taken along section line I-I' of FIG. 1.

Hereinafter, an exemplary embodiment of the display device according to the inventive concept will be explained with respect to a liquid crystal display ("LCD") device; however, an exemplary embodiment is not limited thereto.

Referring to FIGS. 1 and 2, a pixel of the display device includes a transistor TFT, a gate transmission member G, a gate insulating layer 311, a pixel electrode 366, a passivation layer 320, a common electrode 130, a light shielding layer 376, a color filter 354, and a liquid crystal layer 333. In such an embodiment, the transistor TFT uses a thin film transistor, and includes a gate electrode GE, a source electrode SE, a drain electrode DE, a semiconductor layer 313, a first ohmic contact layer 315a, and a second ohmic contact layer 315b.

Meanwhile, although not illustrated, the pixel further includes a first polarizer and a second polarizer. When surfaces of a first substrate 301 and a second substrate 302 that oppose one another, e.g., inner surfaces, are defined as upper surfaces of the corresponding substrates, respectively, and surfaces of the first substrate 301 and the second substrate 302 opposite to the upper surfaces thereof, e.g., outer surfaces, are defined as lower surfaces of the corresponding substrates, respectively, the first polarizer may be disposed on the lower surface of the first substrate 301, and the second polarizer may be disposed on the lower surface of the second substrate 302.

A transmission axis of the first polarizer and a transmission axis of the second polarizer perpendicularly intersect one another, and one of the transmission axes is aligned to be parallel to a gate line GL. Meanwhile, the display device may only include one of the first polarizer and the second polarizer.

The first substrate 301 and the second substrate 302 may use an insulating substrate including or formed of glass or plastic.

As illustrated in FIG. 1, the gate transmission member G is disposed on the first substrate 301. The gate transmission member G includes the gate line GL and the gate electrode GE. The gate line GL may have a width different from a width of the gate electrode GE. For example, the gate electrode GE may have a width wider than that of the gate line GL.

Meanwhile, the gate transmission member G may further include a first compensation pattern 194. The first compensation pattern 194 protrudes from the gate line GL toward the pixel electrode 366.

The gate line GL, the gate electrode GE, and the first compensation pattern 194 are integrally formed.

Although not illustrated, the gate transmission member G may have an end portion wider than another portion thereof in size, so as to be connected to another layer or a gate driving circuit.

The gate electrode GE may be a portion of the gate line GL. In an alternative exemplary embodiment, the gate electrode GE, as illustrated in FIG. 1, may have a shape protruding from the gate line GL.

The gate transmission member G, as illustrated in FIG. 2, includes a first conductive layer pattern Ga and a second conductive layer pattern Gb. In an exemplary embodiment, the gate transmission member G may include two types of conductive layer patterns Ga and Gb that are vertically stacked.

The first conductive layer pattern Ga of the gate transmission member G is disposed on the first substrate 301. The first conductive layer pattern Ga may serve to enhance adhesion between the first substrate 301 and the second conductive layer pattern Gb. The first conductive layer pattern Ga may include or be formed of a transparent conductive material such as indium-tin oxide ("ITO"), indium-zinc oxide ("IZO"), aluminum-zinc oxide ("AZO"), and indium-gallium-zinc oxide ("IGZO"). For example, the first conductive layer pattern Ga may include at least one of ITO, IZO, AZO and IGZO. In such an embodiment, ITO may be a polycrystalline or monocrystalline material, and IZO may also be a polycrystalline or monocrystalline material.

The second conductive layer pattern Gb of the gate transmission member G is disposed on the first conductive layer pattern Ga. The second conductive layer pattern Gb of the gate transmission member G may include or be formed of one of an aluminum (Al)-based metal such as Al or an Al alloy thereof, a silver (Ag)-based metal such as Ag or a Ag alloy thereof, a copper (Cu)-based metal such as Cu or a Cu alloy thereof, and/or a molybdenum (Mo)-based metal such as Mo or a Mo alloy thereof. In an alternative exemplary embodiment, the second conductive layer pattern Gb of the gate transmission member G may include or be formed of one of chromium (Cr), tantalum (Ta), and/or titanium (Ti).

The pixel electrode 366 is disposed on the first substrate 301. In detail, the pixel electrode 366 is disposed on a pixel region of the first substrate 301. The pixel electrode 366 and the first conductive layer pattern Ga of the gate transmission member G are disposed on the same layer. The pixel electrode 366 and the first conductive layer pattern Ga may include or be formed of the same material. The pixel electrode 366 and the first conductive layer pattern Ga are spaced apart from one another at a predetermined interval.

The gate insulating layer 311 is disposed on the gate transmission member G and the pixel electrode 366. In such an embodiment, the gate insulating layer 311 may be disposed over an entire surface of the first substrate 301 including the gate transmission member G and the pixel electrode 366. The gate insulating layer 311 may include or be formed of silicon nitride (SiNx) or silicon oxide (SiOx). The gate insulating layer 311 may have a multilayer structure including two or more insulating layers having different physical properties from one another.

A pixel contact hole 902 is defined in the gate insulating layer 311 to penetrate therethrough. A portion of the pixel electrode 366 is exposed through the pixel contact hole 902.

The semiconductor layer 313 is disposed on the gate insulating layer 311. In such an embodiment, the semiconductor layer 313 overlaps at least a portion of the gate electrode GE of the gate transmission member G. The semiconductor layer 313 may include or be formed of amorphous silicon, polycrystalline silicon, or the like.

The first and second ohmic contact layers 315a and 315b, as illustrated in FIG. 2, are disposed on the semiconductor layer 313. The first and second ohmic contact layers 315a and 315b face one another while having a channel of the semiconductor layer 313 therebetween. At least one of the first and second ohmic contact layers 315a and 315b may include or be formed of silicide, or n+ hydrogenated amorphous silicon doped with n-type impurities, such as phosphorus, at high concentration.

The source electrode SE is disposed on the first ohmic contact layer 315a and the gate insulating layer 311. The source electrode SE and the data line DL are integrally formed. At least a portion of the source electrode SE overlaps the semiconductor layer 313 and the gate electrode GE. The source electrode SE may have one of an I-shape, a C-shape, and a U-shape. Although not illustrated, the semiconductor layer 313 and the ohmic contact layer 315a and/or 315b may further be disposed between the source electrode SE and the gate insulating layer 311.

In particular, the source electrode SE may include or be formed of refractory metal such as molybdenum (Mo), chromium (Cr), tantalum (Ta) and titanium (Ti), or an alloy thereof. The source electrode SE may have a multilayer structure including a refractory metal layer and a low-resistance conductive layer. Examples of the multilayer structure may include: a double-layer structure including a Cr or Mo (alloy) lower layer and an Al (alloy) upper layer; and a triple-layer structure including a Mo (alloy) lower layer, an Al (alloy) intermediate layer, and a Mo (alloy) upper layer. Further, the source electrode SE may include or be formed of various metals or conductive materials, in addition to, or instead of, the aforementioned materials.

The drain electrode DE is disposed on the second ohmic contact layer 315b and the gate insulating layer 311. At least a portion of the drain electrode DE overlaps the semiconductor layer 313 and the gate electrode GE. The drain electrode DE is connected to the pixel electrode 366 through a connection electrode 603. Although not illustrated, the semiconductor layer 313 and the ohmic contact layer 315a and/or 315b may further be disposed between the drain electrode DE and the gate insulating layer 311.

A second compensation pattern 195 protrudes from the drain electrode DE to overlap the first compensation pattern 194. The second compensation pattern 195 and the drain electrode DE are integrally formed. The first compensation pattern 194 and the second compensation pattern 195 significantly reduce a deviation of capacitance between pixels due to a misalignment of a mask. The capacitance corresponds to capacitance of a capacitor formed in an overlapping portion between the gate transmission member G and the drain electrode DE. The second compensation pattern 195 may have the same structure (multilayer structure) and may include the same material as those of the source electrode SE. In other words, the second compensation pattern 195 and the source electrode SE may be simultaneously formed in the same process. Although not illustrated, the semiconductor layer 313 and the ohmic contact layer 315a and/or 315b may further be disposed between the second compensation pattern 195 and the gate insulating layer 311.

The data line DL is disposed on the gate insulating layer 311. Although not illustrated, the data line DL may have a connection portion, for example, an end portion thereof, which is greater than another portion thereof in size, to be connected to another layer or an external driving circuit. The data line DL intersects the gate line GL. Although not illustrated, the data line DL may have a narrower line width at a portion thereof intersecting the gate line GL than a line width of another portion thereof. Accordingly, parasitic capacitance between the data line DL and the gate line GL may decrease. To significantly increase the transmittance of the display device, a center portion of the data line DL may be bent to have a V-shape. Although not illustrated, the semiconductor layer 313 and the ohmic contact layer 315a and/or 315b may further be disposed between the data line DL and the gate insulating layer 311. The data line DL may include the same material and may have the same structure (multilayer structure) as those of the source electrode SE. In other words, the data line DL and the source electrode SE may be simultaneously formed in the same process.

The passivation layer 320 is disposed on the data line DL, the source electrode SE, and the drain electrode DE. In such an embodiment, the passivation layer 320 may be disposed over an entire surface of the first substrate 301 including the data line DL, the source electrode SE, and the drain electrode DE.

The passivation layer 320 may include or be formed of an inorganic insulating material such as $SiN_X$ or $SiO_X$. In the case that the passivation layer 320 includes or is formed of such an inorganic insulating material, the inorganic insulating material may have photosensitivity and a dielectric constant of about 4.0. In an alternative exemplary embodiment, the passivation layer 320 may also have a double-layer structure including a lower inorganic layer and an upper organic layer. The double-layer structure of the passivation layer 320 may have a relatively high insulating property, and may significantly reduce damage to an exposed portion of the semiconductor layer 313. The passivation layer 320 may have a thickness of greater than or equal to about 5000 angstroms (Å), and more particularly, in a range of about 6000 Å to about 8000 Å.

A drain contact hole 901 and the pixel contact hole 902 are defined in the passivation layer 320 to penetrate therethrough. A portion of the drain electrode DE is exposed through the drain contact hole 901, and a portion of the pixel electrode 366 is exposed through the pixel contact hole 902.

The common electrode 130 receives a common voltage from a power supply (not illustrated). The common electrode 130 is disposed on the passivation layer 320. The common electrode 130 overlaps the pixel electrode 366. Common electrodes of the pixels are connected to one another.

The common electrode 130 may include the same material and may have the same structure (multilayer structure) as those of the pixel electrode 366.

Figure 3:
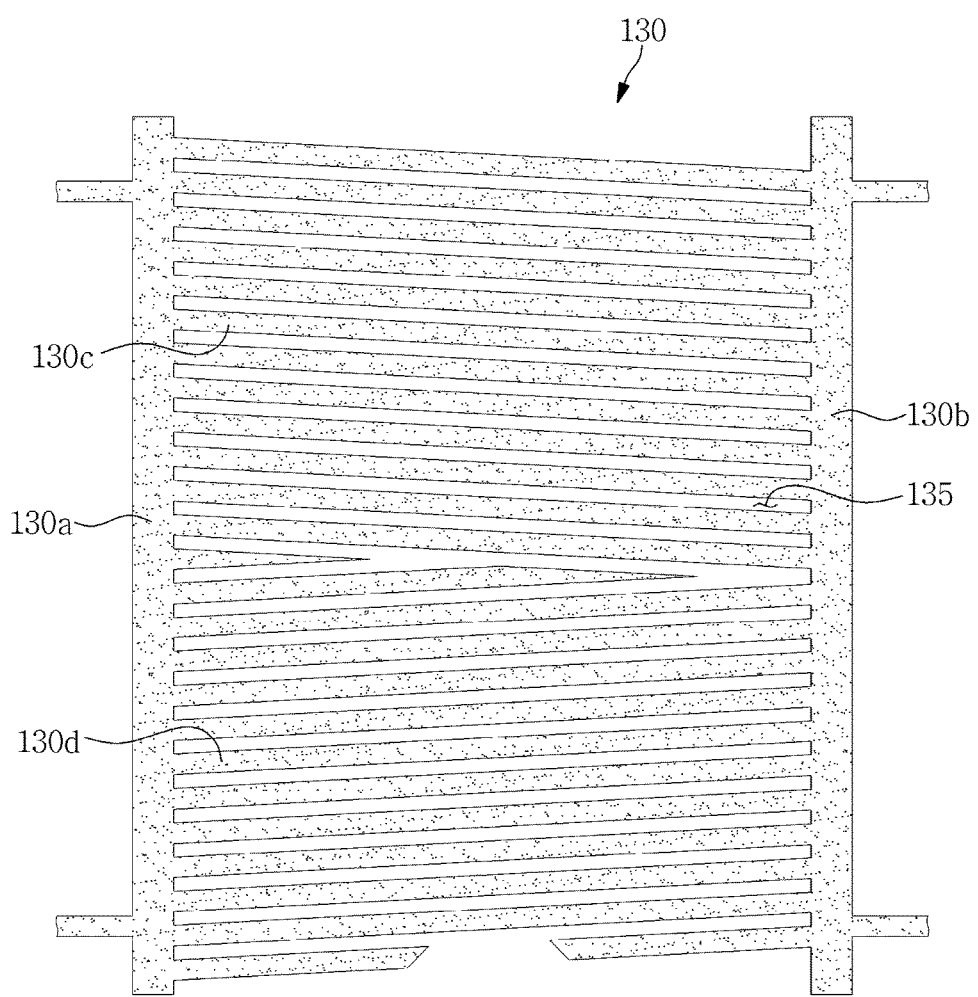
FIG. 3 is a view illustrating a common electrode of FIG. 1.

FIG. 3 is a view illustrating the common electrode 130 of FIG. 1.

Referring to FIG. 3, the common electrode 130 includes a first vertical portion 130a, a second vertical portion 130b, and one or more diagonal portions 130c and 130d.

The first vertical portion 130a and the second vertical portion 130b are arranged to be substantially parallel to the data line DL. The first vertical portion 130a is disposed at one edge of the pixel electrode 366 to overlap the one edge of the pixel electrode 366. The second vertical portion 130b is disposed at another edge of the pixel electrode 366 to overlap the another edge of the pixel electrode 366.

The one or more diagonal portions 130c and 130d are disposed between the first vertical portion 130a and the second vertical portion 130b. The first vertical portion 130a and the second vertical portion 130b overlap the pixel electrode 366. The one or more diagonal portions 130c and 130d are connected to at least one of the first vertical portion 130a and the second vertical portion 130b. A slit 135 is defined between adjacent ones of the diagonal portions 130c and 130d to expose the pixel electrode 366 therethrough.

The diagonal portions 130c and 130d may be divided into a first group including the diagonal portions 130c and a second group including the diagonal portions 130d. The diagonal portions 130c included in the first group are parallel to one another. The diagonal portions 130d included in the second group are parallel to one another. The diagonal portions 130c included in the first group and the diagonal portions 130d included in the second group are not parallel to one another.

The connection electrode 603 is disposed on the passivation layer 320. The connection electrode 603 overlaps the pixel electrode 366 and the drain electrode DE. The connection electrode 603 connects the pixel electrode 366 and the drain electrode DE through the drain contact hole 901 and the pixel contact hole 902.

The connection electrode 603 may include the same material and may have the same structure (multilayer structure) as those of the common electrode 130. The common electrode 130 and the connection electrode 603 may be formed by the same process.

The light shielding layer 376 is disposed on the second substrate 302. The light shielding layer 376 may reduce or effectively prevent light leakage from an area other than the pixel region. In other words, the light shielding layer 376 may reduce or effectively prevent light leakage from a non-pixel region. To this end, the light shielding layer 376 has an aperture corresponding to the pixel region so as to cover all areas other than the pixel region.

The color filter 354 is disposed on the second substrate 302. In detail, the color filter 354 is disposed to correspond to the pixel region of the second substrate 302. The color filter 354 may include a red color filter, a green color filter, and a blue color filter, by way of example.

Meanwhile, the color filter 354 and the light shielding layer 376 may be disposed on the first substrate 301, rather than on the second substrate 302.

The liquid crystal layer 333 may have a negative dielectric anisotropy and may include vertically aligned liquid crystal molecules.

Figure 4A:
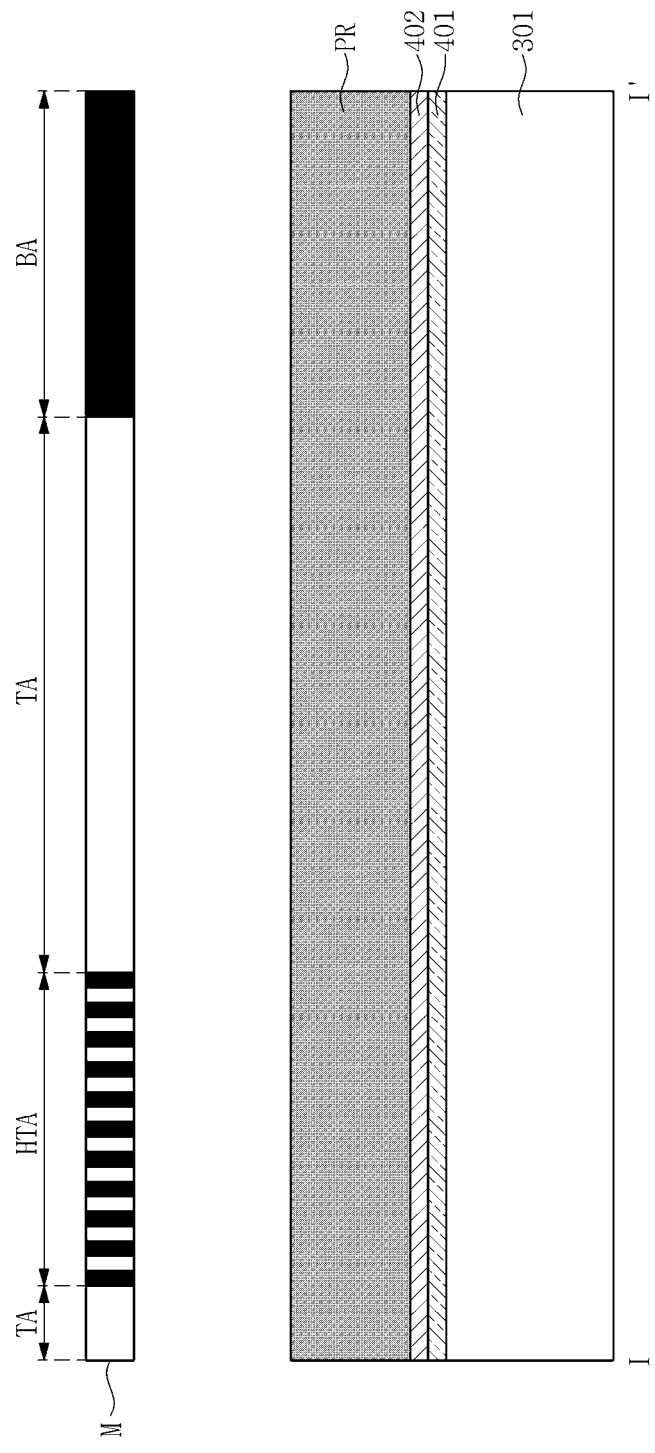
Figure 4B:
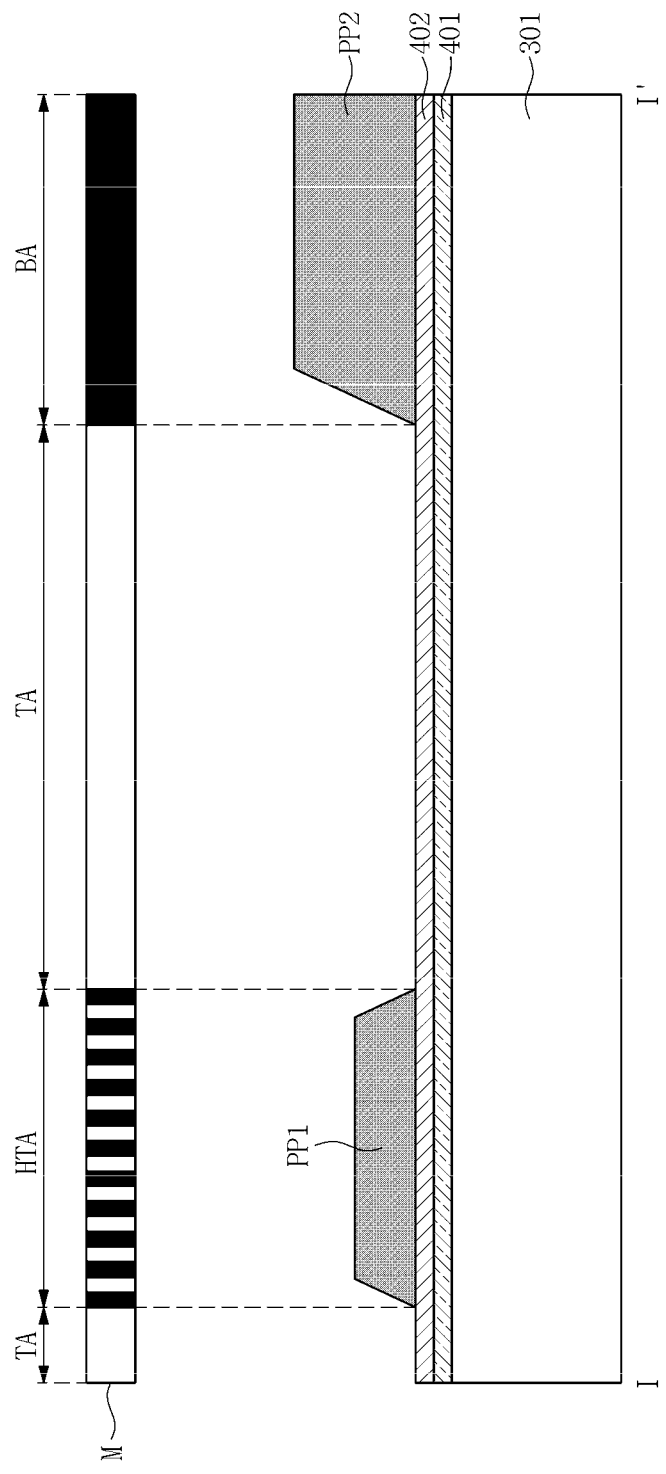
Figure 4C:
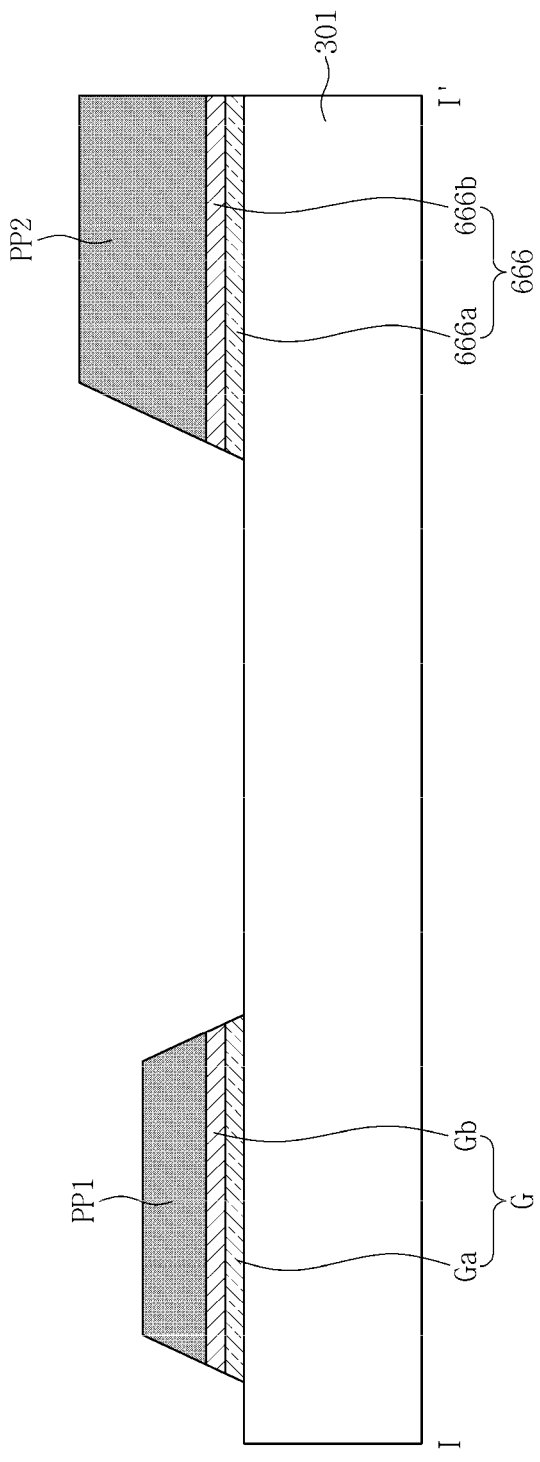
Figure 4D:
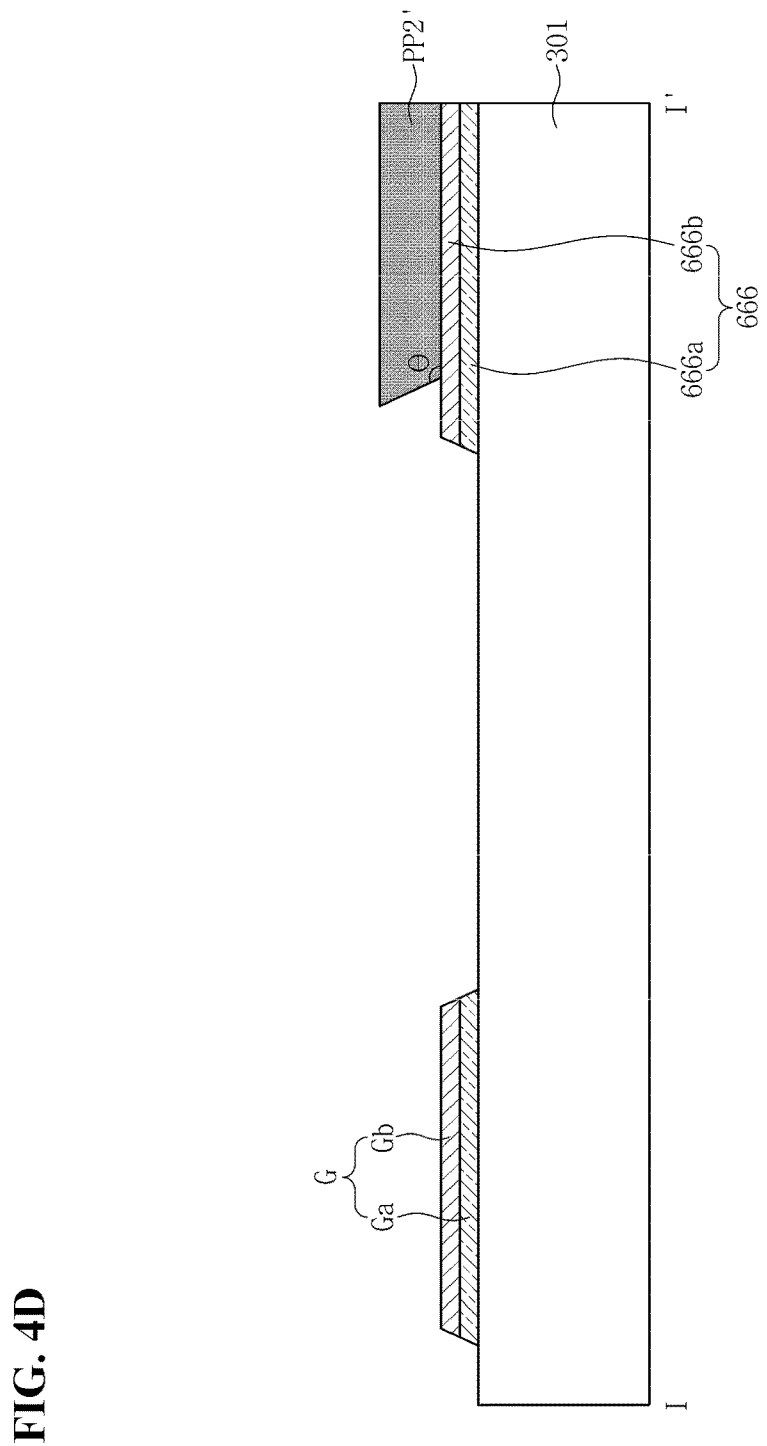
Figure 4E:
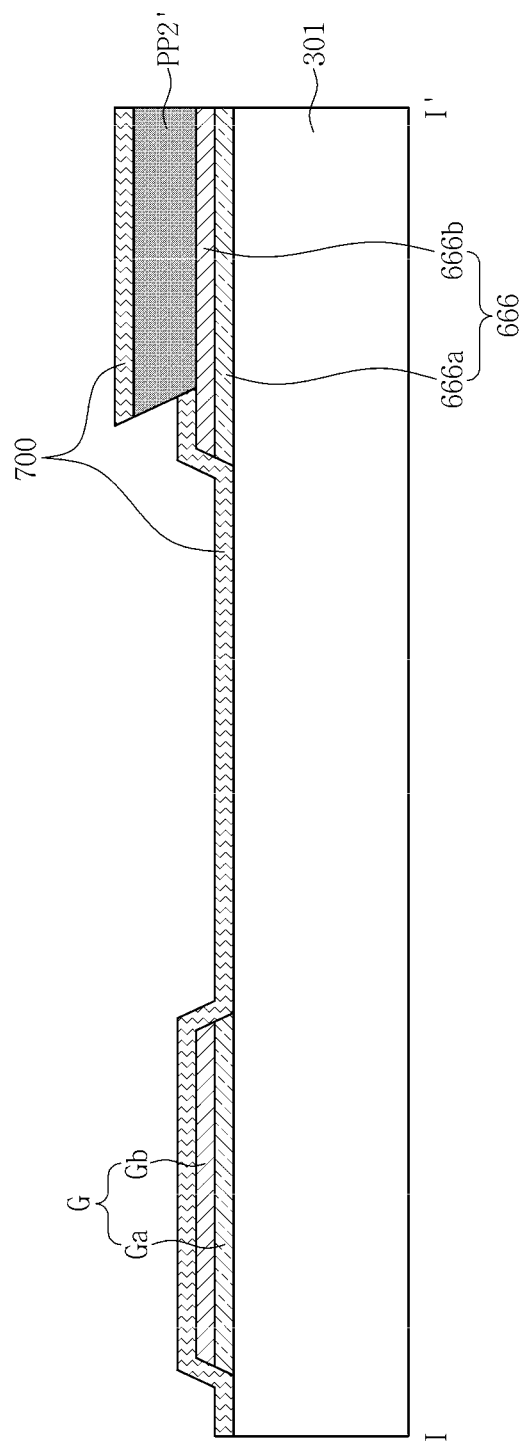
Figure 4F:
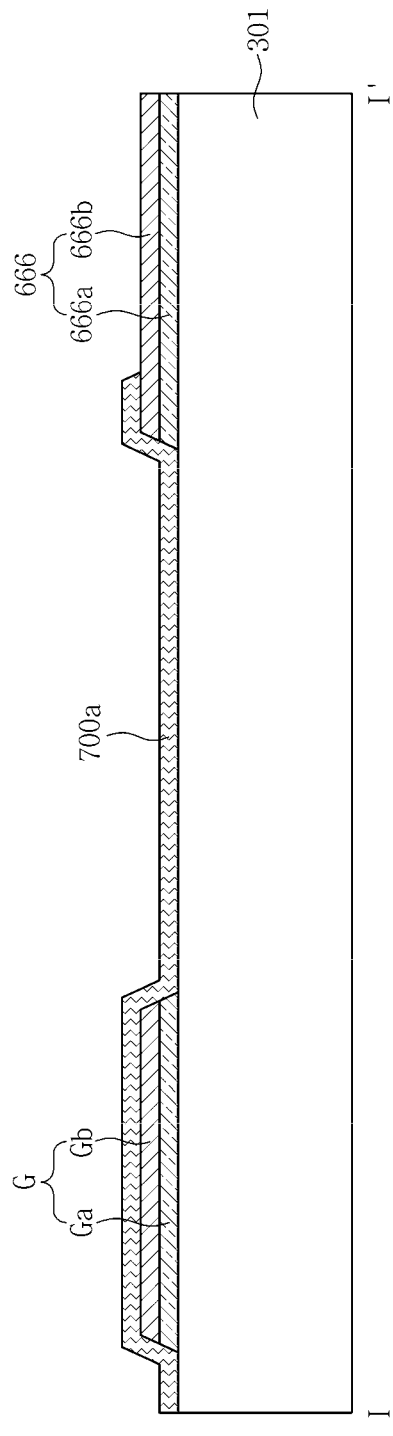
Figure 4H:
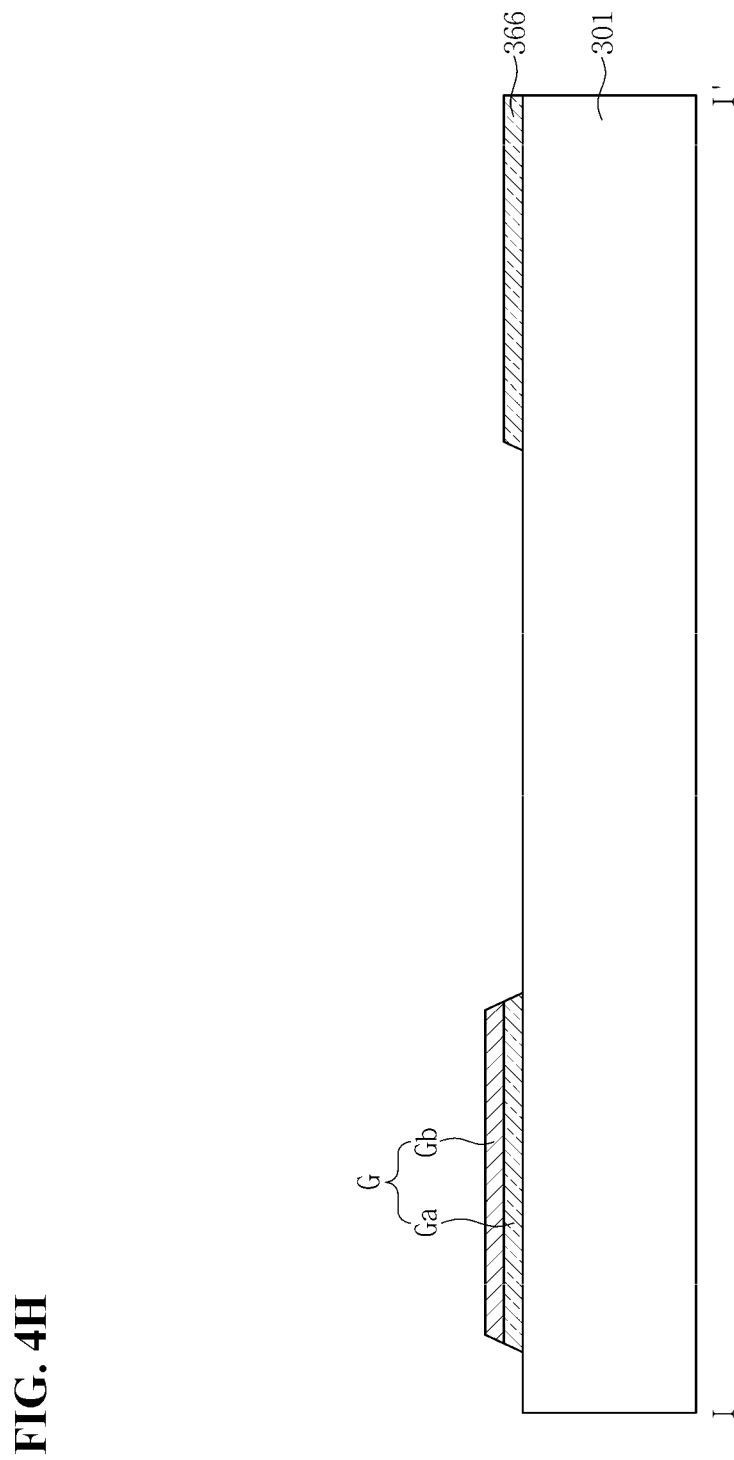
Figure 4I:
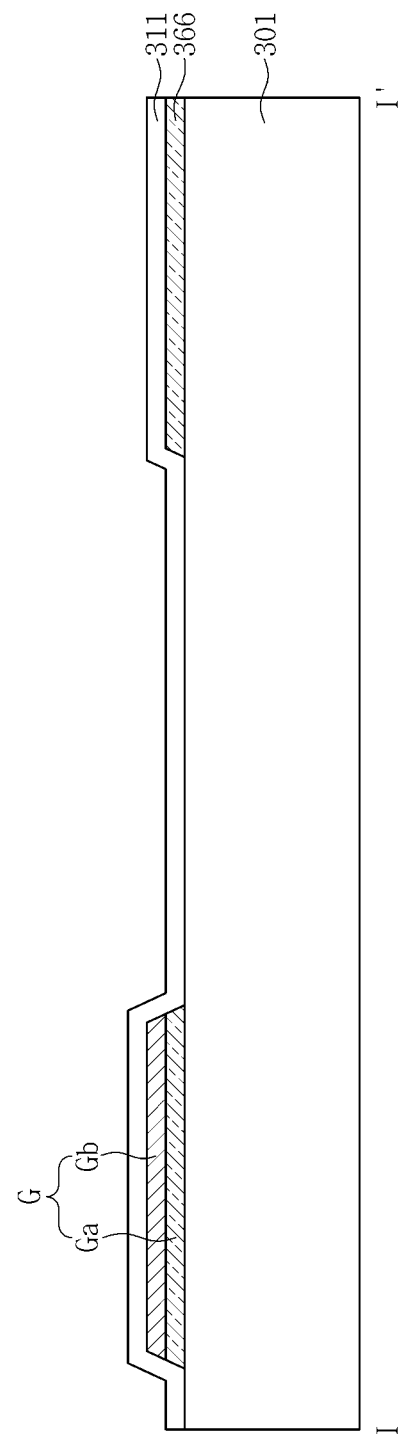
Figure 4J:
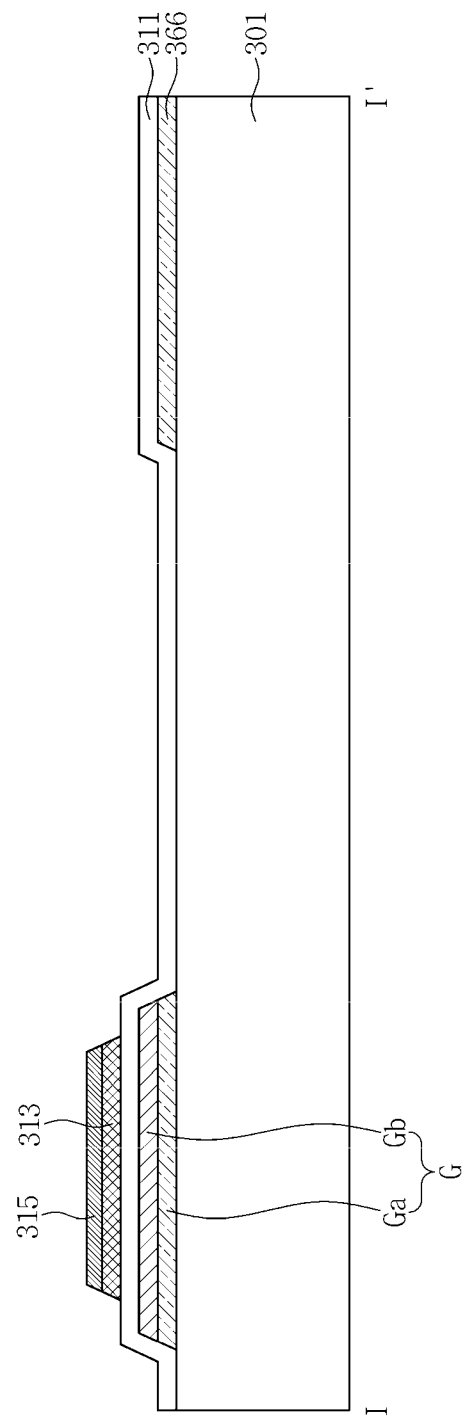
Figure 4K:
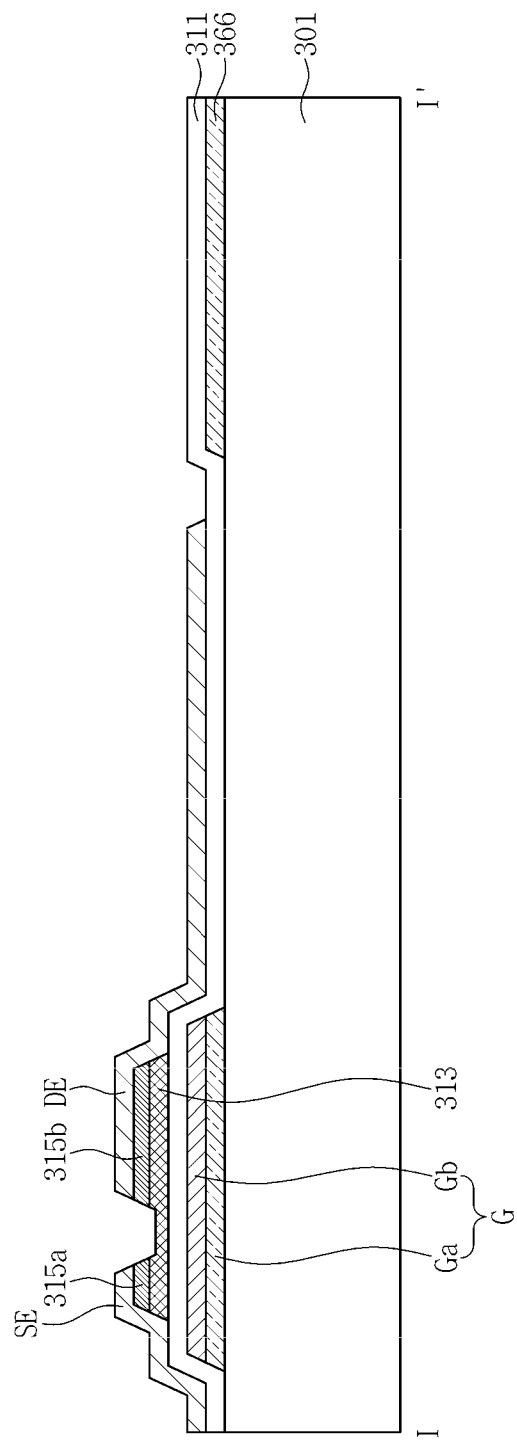
Figure 4L:
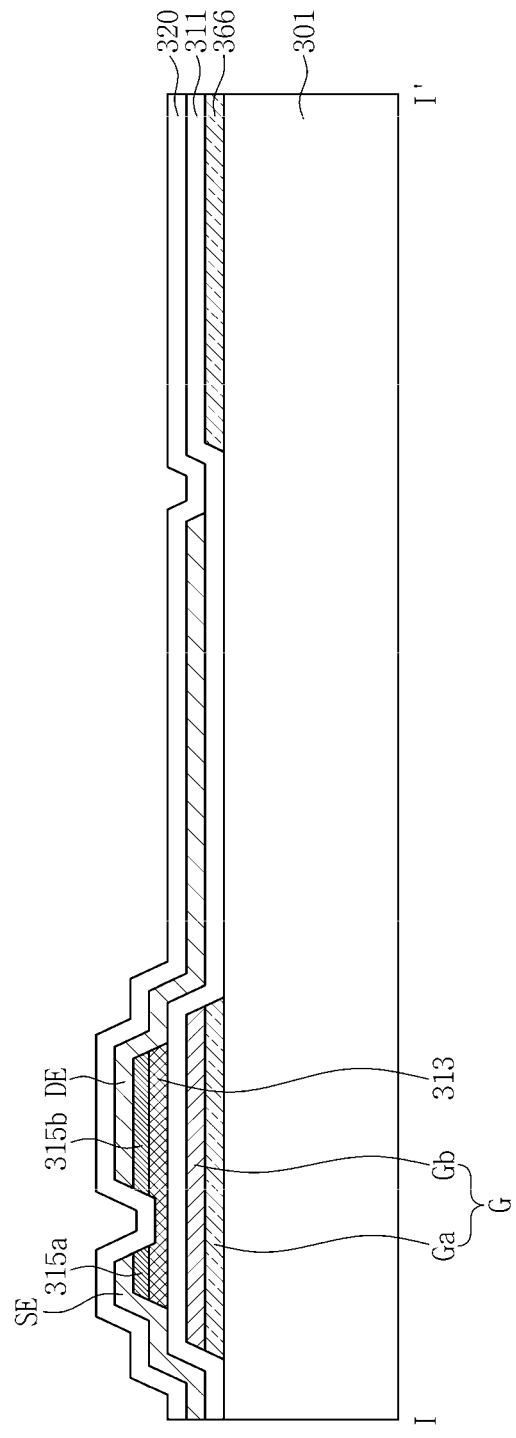
Figure 4M:
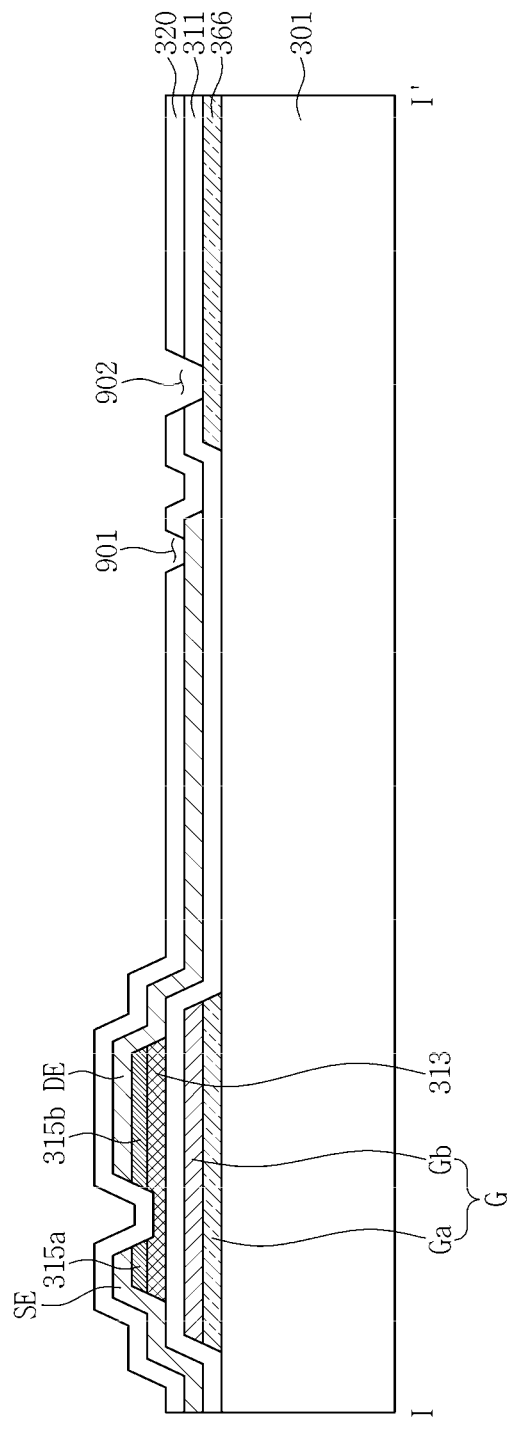
Figure 4N:
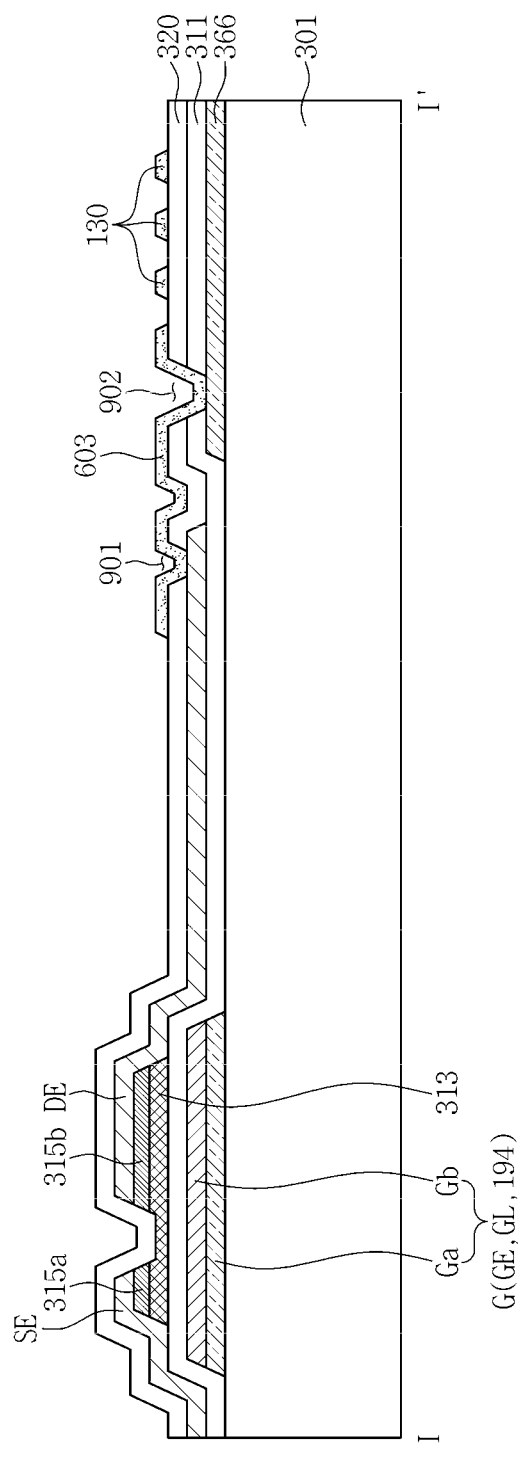

FIGS. 4A to 4N are views illustrating a method of manufacturing the display device according to an exemplary embodiment.

Referring to FIG. 4A, a first conductive layer 401 is formed on the first substrate 301. The first conductive layer 401 is formed over an entire surface of the first substrate 301. A second conductive layer 402 is formed on the first conductive layer 401. The second conductive layer 402 is formed over an entire surface of the first substrate 301 including the first conductive layer 401.

The first conductive layer 401 may be deposited on the first substrate 301 by a physical vapor deposition ("PVD") process such as a sputtering process. In addition, the second conductive layer 402 may be deposited on the first conductive layer 401 by the PVD process.

The first conductive layer 401 may include or be formed of at least one of ITO, IZO, AZO and IGZO. In such an embodiment, ITO may be a polycrystalline or monocrystalline material, and IZO may also be a polycrystalline or monocrystalline material.

The second conductive layer 402 may include or be formed of at least one of an aluminum (Al)-based metal such as Al or an Al alloy thereof, a silver (Ag)-based metal such as Ag or a Ag alloy thereof, a copper (Cu)-based metal such as Cu or a Cu alloy thereof, and/or a molybdenum (Mo)-based metal such as Mo or a Mo alloy thereof. In an alternative exemplary embodiment, the second conductive layer 402 may include or be formed of one of chromium (Cr), tantalum (Ta), and/or titanium (Ti).

A negative photoresist PR is coated over an entire surface of the first substrate 301 including the first and second conductive layers 401 and 402.

A mask M is disposed above the photoresist PR. The mask M includes a transmissive area TA through which light is transmitted, a blocking area BA by which light is blocked, and a semi-transmissive area HTA through which light is partially transmitted. A plurality of slits may be defined in the semi-transmissive area HTA, or alternatively, the semi-transmissive area HTA may include a semi-transparent layer.

Light such as ultraviolet ("UV") light is selectively irradiated to the photoresist PR through the mask M to thereby expose the photoresist PR. When the exposed photoresist PR is developed, as illustrated in FIG. 4B, a first photoresist pattern PP1 and a second photoresist pattern PP2 having different thicknesses from one another are formed on the second conductive layer 402. The second photoresist pattern PP2 corresponding to the blocking area BA of the mask M has a greater thickness than that of the first photoresist pattern PP1 corresponding to the semi-transmissive area HTA of the mask M. A portion of the photoresist PR corresponding to the transmissive area TA of the mask M is removed. Although not shown in FIG. 4B, the exposed photoresist PR is developed after the mask M is removed.

The first photoresist pattern PP1 is disposed in an area to be formed with the gate transmission member G, and the second photoresist pattern PP2 is disposed in an area to be formed with the pixel electrode 366.

The second conductive layer 402 and the first conductive layer 401 are sequentially etched using the first photoresist pattern PP1 and the second photoresist pattern PP2 as masks. Referring to FIG. 4C, the gate transmission member G and a pixel electrode pattern 666 are formed on the first substrate 301. In such an embodiment, the gate transmission member G includes the first conductive layer pattern Ga and the second conductive layer pattern Gb vertically stacked on the first conductive layer pattern Ga.

The first conductive layer 401 and the second conductive layer 402 may be removed by a wet-etching process using an wet etchant.

Referring to FIG. 4D, the first photoresist pattern PP1 disposed on the gate transmission member G and having a relatively small thickness is entirely removed by a chemical ashing process, such that the gate transmission member G is exposed. Meanwhile, the second photoresist pattern PP2 disposed on the pixel electrode pattern 666 and having a relatively great thickness is partially removed by the ashing process, so as to have a reduced thickness and width. Hereinafter, the ashed second photoresist pattern PP2 is defined as a residual pattern PP2' of the second photoresist pattern PP2.

A side surface of the residual pattern PP2' has a reverse taper angle. For example, one surface of the residual pattern PP2' facing a second conductive layer pattern 666b and the side surface of the residual pattern PP2' form an obtuse angle θ therebetween. In such an embodiment, the one surface of the residual pattern PP2' facing the second conductive layer pattern 666b has a smaller planar area than a planar area of another surface of the residual pattern PP2' opposite to the one surface of the residual pattern PP2' facing the second conductive layer pattern 666b.

A size of the angle θ between the one surface of the residual pattern PP2' facing the second conductive layer pattern 666b and the side surface of the residual pattern PP2' may be adjusted by ashing time. As the ashing time for the ashing process increases, the angle θ increases.

Referring to FIG. 4E, an etch stop layer 700 is formed on the gate transmission member G and the residual pattern PP2'. In such an embodiment, the etch stop layer 700 may be formed over an entire surface of the first substrate 301 including the gate transmission member G and the residual pattern PP2'. For example, as illustrated in FIG. 4E, the etch stop layer 700 may be disposed on the second conductive layer pattern Gb of the gate transmission member G, the residual pattern PP2', the first substrate 301, and the second conductive layer pattern 666b of the pixel electrode pattern 666. In such an embodiment, a portion of the etch stop layer 700 may have a disconnection portion along an edge of the residual pattern PP2'. For example, the etch stop layer 700 may be formed on the gate transmission member G, the first substrate 301, the pixel electrode pattern 666 and the residual pattern PP2' but may not be formed on a side surface of the residual pattern PP2'.

The etch stop layer 700 may include a self-assembled monolayer.

The self-assembled monolayer may include a compound represented by the following Chemical Formula 1.

[Chemical Formula 1]

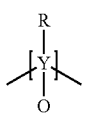

In Chemical Formula 1, Y is one of sulfur, silicon, phosphorus, carbon, sulfur bonded to a substituent, silicon bonded to a substituent, phosphorus bonded to a substituent, and carbon bonded to a substituent.

In Chemical Formula 1, R is one selected from a C6-C30 hydrocarbon group, a C6-C30 aromatic group, a C5-C30 heteroaromatic group including at least one heteroatom, a C1-C20 alkyl group, a C6-C30 hydrocarbon group bonded to a substituent, a C6-C30 aromatic group bonded to a substituent, a C5-C30 heteroaromatic group including at least one heteroatom and bonded to a substituent, and a C1-C20 alkyl group bonded to a substituent. In such an embodiment, a main chain of the C1-C20 alkyl group may contain at least one of

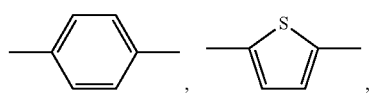

-continued

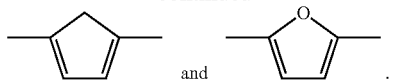

The substituent includes at least one of halogen, a C1-C12 alkyl group, a C1-C12 alkyl group bonded to another substituent, an alkoxy group, an ether group, a carboxyl group, a thiol group, and an amine group.

In an alternative exemplary embodiment, the self-assembled monolayer may include a compound represented by the following Chemical Formula 2.

[Chemical Formula 2]

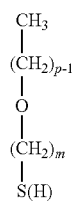

In Chemical Formula 2, m and p are each an integer in a range of 1 to 10.

Referring to FIG. 4F, the residual pattern PP2' is removed. In such an embodiment, when the residual pattern PP2' is removed, the etch stop layer 700 on the residual pattern PP2' is removed together therewith. The residual pattern PP2' may be removed using a stripping solution. The stripping solution may include ethylene carbonate. The residual pattern PP2' and the etch stop layer 700 on the residual pattern PP2' may be removed together by a lift-off process, for example.

As the etch stop layer 700 on the residual pattern PP2' is removed, as illustrated in FIG. 4F, an etch stop layer pattern 700a is formed to expose a portion of the pixel electrode pattern 666 therethrough. In such an embodiment, the portion of the pixel electrode pattern 666 being exposed is a portion of the second conductive layer pattern 666b included in the pixel electrode pattern 666.

Referring to FIG. 4G, the second conductive layer pattern 666b of the pixel electrode pattern 666 is selectively removed using the etch stop layer pattern 700a as a mask. As the second conductive layer pattern 666b of the pixel electrode pattern 666 is removed, the pixel electrode 366 is formed. In other words, the second conductive layer pattern 666b of the pixel electrode pattern 666 is removed so as to expose a first conductive layer pattern 666a, and the first conductive layer pattern 666a being exposed is the pixel electrode 366.

As such, the pixel electrode 366, and the gate transmission member G including the first conductive layer pattern Ga as an adhesive layer are simultaneously formed by a single mask process. It is due to the half-ton mask process and the etch stop layer 700 including the self-assembled monolayer. The self-assembled monolayer does not removed by both the stripping solution and the wet etchant. Therefore, the self-assembled monolayer be used as mask for patterning the second conductive pattern 666b.

Meanwhile, the second conductive layer pattern 666b may be removed by a wet-etching process using an etchant. In such an embodiment, an over-etching process may be performed to remove the second conductive layer pattern 666b, so as to remove even a portion of the second conductive layer pattern 666b between the etch stop layer pattern 700a and the first conductive layer pattern 666a of the pixel electrode pattern 666. A period of time for the over-etching process may be two times longer than a period of time for a general etching process.

When the second conductive layer pattern 666b is removed by the wet-etching process, the gate transmission member G is protected by the etch stop layer pattern 700a. Accordingly, damage to the gate transmission member G by the etchant during the wet-etching process may be prevented.

Referring to FIG. 4H, the etch stop layer pattern 700a is removed. The etch stop layer pattern 700a may be removed by a dry-etching process using an etching gas. Meanwhile, even when the etch stop layer pattern 700a is removed, components included in the self-assembled monolayer may remain on the gate transmission member G, the pixel electrode pattern 666, and the first substrate 301 which have contacted the etch stop layer 700. For example, compounds of the Chemical Formula 1 or Chemical Formula 2 may remain on the gate transmission member G, the pixel electrode pattern 666, and the first substrate 301. Alternatively, a portion of the etch stop layer pattern 700a may remain on the gate transmission member G, the pixel electrode pattern 666, and the first substrate 301.

Referring to FIG. 4I, the gate insulating layer 311 is formed over an entire surface of the first substrate 301 including the gate transmission member G and the pixel electrode 366.

A semiconductor material such as amorphous silicon or polycrystalline silicon, and an ohmic contact layer such as silicide, or n+ hydrogenated amorphous silicon doped with n-type impurities, such as phosphorus, at high concentration are sequentially deposited over an entire surface of the first substrate 301 including the gate insulating layer 311. As the semiconductor material and the ohmic contact layer are selectively removed by a photolithography process, as illustrated in FIG. 4J, the semiconductor layer 313 and an ohmic contact layer 315 are formed to overlap the gate electrode GE of the gate transmission member G.

A source metal layer is formed over an entire surface of the first substrate 301 including the ohmic contact layer 315 and the gate insulating layer 311. As the source metal layer is selectively removed by a photolithography process, as illustrated in FIG. 4K, the source electrode SE and the drain electrode DE are formed to overlap the semiconductor layer 313 and the gate electrode GE. In such an embodiment, a portion of the ohmic contact layer 315 on a channel region of the semiconductor layer 313 is entirely removed by the etching process, such that the first ohmic contact layer 315a and the second ohmic contact layer 315b separated from one another are formed. In addition, a portion of the semiconductor layer 313 in the channel region is removed by the etching process.

Meanwhile, the semiconductor layer 313, the first ohmic contact layer 315a, the second ohmic contact layer 315b, the source electrode SE, and the drain electrode DE may be formed by a conventional diffraction exposure process using a mask including the aforementioned semi-transmissive area. In such an embodiment, the semiconductor layer 313, the first ohmic contact layer 315a, the second ohmic contact layer 315b, the source electrode SE, and the drain electrode DE may be simultaneously formed.

Referring to FIG. 4L, the passivation layer 320 is formed over an entire surface of the first substrate 301 including the source electrode SE, the drain electrode DE, and the channel region of the semiconductor layer 313.

As the passivation layer 320 and the gate insulating layer 311 are selectively removed by a photolithography process, as illustrated in FIG. 4M, the drain contact hole 901 through which the drain electrode DE is exposed and the pixel contact hole 902 through which the pixel electrode 366 is exposed are formed.

A transparent electrode material such as ITO, IZO, AZO and IGZO is formed over an entire surface of the first substrate 301 including the passivation layer 320 and the drain electrode DE. As the transparent electrode material is selectively removed by a photolithography process, as illustrated in FIG. 4N, the common electrode 130 and the connection electrode 603 are formed. The common electrode 130 is disposed on the passivation layer 320 to overlap the pixel electrode 366. The connection electrode 603 is disposed on the passivation layer 320 to overlap the drain electrode DE and the pixel electrode 366. In addition, the connection electrode 603 is connected to the drain electrode DE through the drain contact hole 901, and is connected to the pixel electrode 366 through the pixel contact hole 902.

As set forth above, according to at least an exemplary embodiment, the gate transmission member including the adhesive layer, and the pixel electrode may be simultaneously formed in a single mask process. Accordingly, the number of manufacturing processes and manufacturing costs may be reduced.

In addition, when the second conductive layer pattern is removed by a wet-etching process, the gate transmission member is protected by the etch stop layer pattern. Accordingly, damage that may be caused to the gate transmission member by an etchant during the wet-etching process may be prevented.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the inventive concept.

What is claimed is:

1. A method of manufacturing a display device comprising:
   forming a first conductive layer on a substrate;
   forming a second conductive layer on the first conductive layer;
   forming a first photoresist pattern on a gate transmission member forming area and a second photoresist pattern on a pixel electrode pattern forming area on the second conductive layer, the second photoresist pattern having a thickness greater than a thickness of the first photoresist pattern;
   removing the first and second conductive layers using the first and second photoresist patterns as masks, to thereby form a gate transmission member and a pixel electrode pattern each comprising a first conductive layer pattern and a second conductive layer pattern;
   removing the first photoresist pattern to thereby form a residual pattern of the second photoresist pattern on the pixel electrode pattern;
   forming an etch stop layer on the gate transmission member and the residual pattern;

removing the residual pattern to thereby form an etch stop layer pattern through which the second conductive layer pattern of the pixel electrode pattern is exposed; and removing the second conductive layer pattern of the pixel electrode pattern using the etch stop layer pattern as a mask, to thereby form a pixel electrode.

2. The method of claim 1, further comprising removing the etch stop layer pattern.

3. The method of claim 1, wherein the etch stop layer comprises a self-assembled monolayer.

4. The method of claim 3, wherein the self-assembled monolayer comprises a compound represented by the following Chemical Formula 1:

[Chemical Formula 1]

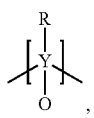

wherein Y is one of sulfur, silicon, phosphorus, carbon, sulfur bonded to a substituent, silicon bonded to a substituent, phosphorus bonded to a substituent, and carbon bonded to a substituent;

wherein R is one selected from a C6-C30 hydrocarbon group, a C6-C30 aromatic group, a C5-C30 heteroaromatic group comprising at least one heteroatom, a C1-C20 alkyl group, a C6-C30 hydrocarbon group bonded to a substituent, a C6-C30 aromatic group bonded to a substituent, a C5-C30 heteroaromatic group comprising at least one heteroatom and bonded to a substituent, and a C1-C20 alkyl group bonded to a substituent; and wherein the substituent comprises at least one of halogen, a C1-C12 alkyl group, a C1-C12 alkyl group bonded to another substituent, an alkoxy group, an ether group, a carboxyl group, a thiol group, and an amine group.

5. The method of claim 4, wherein a main chain of the C1-C20 alkyl group contains at least one of

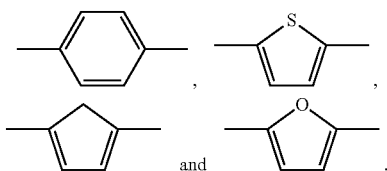

and .

6. The method of claim 3, wherein the self-assembled monolayer comprises a compound represented by the following Chemical Formula 2:

[Chemical Formula 2]

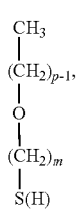

wherein m and p are each an integer in a range of 1 to 10.

7. The method of claim 1, wherein the etch stop layer is formed over an entire surface of the substrate comprising the gate transmission member and the residual pattern except on a side surface of the residual pattern.

8. The method of claim 1, wherein the residual pattern has a thickness and a width less than a thickness and a width of the second photoresist pattern.

9. The method of claim 1, wherein the first conductive layer comprises at least one of indium-tin oxide ("ITO"), indium-zinc oxide ("IZO"), aluminum-zinc oxide ("AZO"), and indium-gallium-zinc oxide ("IGZO").

10. The method of claim 1, wherein the second conductive layer comprises at least one of molybdenum (Mo), chromium (Cr), titanium (Ti), aluminum (Al), silver (Ag), and copper (Cu).

11. The method of claim 1, wherein the gate transmission member comprises a gate electrode and a gate line.

12. A method of manufacturing a display device comprising:

forming a first conductive layer on a substrate;
forming a second conductive layer on the first conductive layer;
forming a first photoresist pattern and a second photoresist pattern on the second conductive layer, the second photoresist pattern having a thickness greater than a thickness of the first photoresist pattern;
removing the first and second conductive layers using the first and second photoresist patterns as masks, to thereby form a gate transmission member and a pixel electrode pattern each comprising a first conductive layer pattern and a second conductive layer pattern;
removing the first photoresist pattern to thereby form a residual pattern of the second photoresist pattern on the pixel electrode pattern;
forming an etch stop layer on the gate transmission member and the residual pattern;
removing the residual pattern to thereby form an etch stop layer pattern through which the second conductive layer pattern of the pixel electrode pattern is exposed; and
removing the second conductive layer pattern of the pixel electrode pattern using the etch stop layer pattern as a mask, to thereby form a pixel electrode,
wherein the etch stop layer has a disconnection portion along an edge of the residual pattern.

13. A method of manufacturing a display device comprising:

forming a first conductive layer on a substrate;
forming a second conductive layer on the first conductive layer;
forming a first photoresist pattern and a second photoresist pattern on the second conductive layer, the second photoresist pattern having a thickness greater than a thickness of the first photoresist pattern;
removing the first and second conductive layers using the first and second photoresist patterns as masks, to thereby form a gate transmission member and a pixel electrode pattern each comprising a first conductive layer pattern and a second conductive layer pattern;
removing the first photoresist pattern to thereby form a residual pattern of the second photoresist pattern on the pixel electrode pattern;
forming an etch stop layer on the gate transmission member and the residual pattern;

removing the residual pattern to thereby form an etch stop layer pattern through which the second conductive layer pattern of the pixel electrode pattern is exposed; and removing the second conductive layer pattern of the pixel electrode pattern using the etch stop layer pattern as a mask, to thereby form a pixel electrode, wherein the residual pattern has a thickness and a width less than a thickness and a width of the second photoresist pattern, wherein one surface of the residual pattern facing the second conductive layer pattern and a side surface of the residual pattern form an obtuse angle therebetween.

14. The method of claim 13, wherein the one surface of the residual pattern facing the second conductive layer pattern has a planar area smaller than a planar area of another surface of the residual pattern opposite to the one surface of the residual pattern facing the second conductive layer pattern.

* * * * *